United States Patent [19]

Hishiro

[11] Patent Number: 5,492,790
[45] Date of Patent: Feb. 20, 1996

[54] POSITIVE PHOTORESIST COMPOSITION CONTAINING A DISSOLUTION INHIBITOR AND A DYE IN AN ORGANIC SOLVENT

[75] Inventor: Yoshiki Hishiro, Toyonaka, Japan

[73] Assignee: Sumitomo Chemical Company, Limited, Osaka, Japan

[21] Appl. No.: 257,904

[22] Filed: Jun. 13, 1994

[30] Foreign Application Priority Data

Jun. 15, 1993 [JP] Japan .................................. 5-143885
Apr. 1, 1994 [JP] Japan .................................. 6-065092

[51] Int. Cl.$^6$ ..................................................... G03F 7/023
[52] U.S. Cl. .......................... 430/191; 430/192; 430/193; 430/270.16
[58] Field of Search .................................... 430/191, 192, 430/193, 220

[56] References Cited

U.S. PATENT DOCUMENTS

| | | | |
|---|---|---|---|
| 5,141,838 | 8/1992 | Aoshima et al. | 430/191 |
| 5,145,763 | 9/1992 | Bassett et al. | 430/191 |
| 5,212,042 | 5/1993 | Shinozaki et al. | 430/191 |
| 5,275,909 | 1/1994 | Jayaraman et al. | 430/191 |
| 5,340,682 | 8/1994 | Pawlowski et al. | 430/191 |

FOREIGN PATENT DOCUMENTS 4-212161  8/1992  Japan .

*Primary Examiner*—Charles L. Bowers, Jr.
*Assistant Examiner*—Christopher G. Young
*Attorney, Agent, or Firm*—Birch, Stewart, Kolasch & Birch

[57] ABSTRACT

A positive photoresist composition applicable for printing and making gas sensors, color filters and the like, without difficulties in process-control for making them, without any deteriorations in the good properties that photoresists originally have, which comprises a compound having at least one group selected from a sulfonamide, carboxylic acid amide and ureido which are substituted at one position, a dissolution inhibitor and an organic solvent and with which a thin color filter having various excellent properties such as color darkness and color reproductivity can be obtained.

16 Claims, No Drawings

POSITIVE PHOTORESIST COMPOSITION CONTAINING A DISSOLUTION INHIBITOR AND A DYE IN AN ORGANIC SOLVENT

This invention relate to a positive photoresist composition used for producing a positive pattern by utilizing the difference between the dissolving rates of exposed and unexposed parts of the photoresist to alkaline developer which is yielded by exposing the photoresist film to a ray such as ultraviolet, far ultraviolet X ray, electron beam or the like. In more detail this invention relates to a positive photoresist composition which can be used for producing semi-conductors; printing plates, color filters used in solid-state color camera elements, color liquid crystal display elements or the like; color images containing coloring matters such as printing inks; gas sensors which is produced by forming membranes containing compounds such as dyes into desired figures; etc.

Hitherto, for producing semiconductors, printing plates or the like, positive photoresists comprising matrix resins such as alkaline-soluble resin or the like and dissolution inhibiters such as quinonediazide sulfonic acid esters have been used. Various kinds of applications of the resist, other than for semiconductors or printing plates, can be expected. However, in the printing field, for example, after forming a resist pattern, complicated processes for coloring with inks are required. Concerning the gas sensors using thin layers which is obtained by spin-coating a composition prepared by dissolving an electroconductive compound such as a phthalocyanine derivative and a resin into a solvent, a method for forming the thin layer into a desired figure has not yet been known.

Recently, a method for producing a color filters by using a resist composition prepared by adding a dye into a matrix resin, a solvent, etc. has been proposed. This method has an advantage that a thinner layer can be obtained comparing to a method by using a casein or a gelatin. However, in order to dye the thin film into a dark color, a large quantity of a dye has to be added. Since dyes such as acid dyes and direct dyes, which have been used for color filters so far, do not have sufficient solubilities to the solvents, the dyes insufficiently dissolved in the resist often deteriorates the good properties the resist originally has.

The object of this invention is to provide a positive photoresist composition which can solve the above-mentioned problems and is applicable, particularly, in the fields of printing producing gas sensors, producing color filters, etc. without any deteriorations in the good properties that the photoresist originally has, without difficulties in process-control.

This invention is a positive photoresist composition which comprises a compound having at least one group selected from a group consisting of a sulfonamide, carboxylicacidamide and ureido group which is substituted at a hydrogen atom (hereinafter referred to as Compound A), a dissolution inhibitor and an organic solvent.

As the compound A, for example;
a cyan dye represented by the following formula (I)

$$(SO_3M)_h—[Pc]—(SO_2—NH—R)_i \qquad (I)$$

wherein Pc is a phthalocyanine nucleus, h and i are the average substitution number of $SO_3M$ and $SO_2$—NH—R respectively, R is an alkyl, cycloalkyl, alkylcabonylaminoalkyl, alkylcabonylamino, cyclohexylalkyl, alkoxy, alkoxyalkyl, aryl, aralkyl or alkylcarbonyloxy group and $SO_3M$ is a sulfonic acid or a sulfonic acid salt, provided that $h+i \leq 4$, $h \leq 3$ and $i=1–4$;

a disazo dye or trisazo dye represented by the following formula (II)

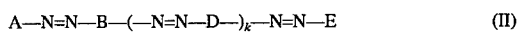

$$A—N=N—B—(—N=N—D—)_k—N=N—E \qquad (II)$$

wherein each of A, B, D and E is independently a benzene or naphthalene ring which may be substituted and k is 0 or 1, provided that at least one of the A, B, D and E is a benzene or naphthalene ring which is substituted by —$SO_2$—NH—R or —$SO_2$—NH—R and —CO—NH—R (R is as defined above);

a yellow dye represented by the following formula (III)

$$G—J—M' \qquad (III)$$

wherein
M' is a group represented by the following formula

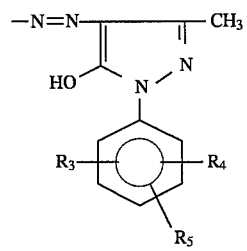

wherein each of $R_3$–$R_5$ is independently a hydrogen atom, an alkyl group, a halogen atom, a sulfonicacid group, a sulfonicacid salt group or —$SO_2$—NH—R (R is as defined above), provided that at least one of the $R_3$–$R_5$ is —$SO_2$—NH—R, J is a crosslinking group represented by one of the following formula

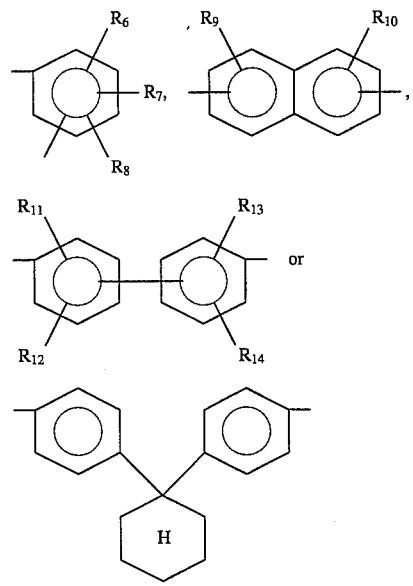

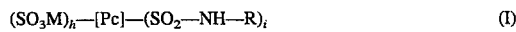

wherein each of $R_6$–$R_{14}$ is independently a hydrogen atom, an alkyl group, a halogen atom, a sulfonicacid group, a sulfonicacid salt group or —$SO_2$—NH—R (R is as defined above), and G is above-mentioned M', a hydrogen atom or a phenylazophenyl, naphthylazophenyl or phenylazonaphthyl group which may be substituted;

a magenta dye represented by the following formula (IV)

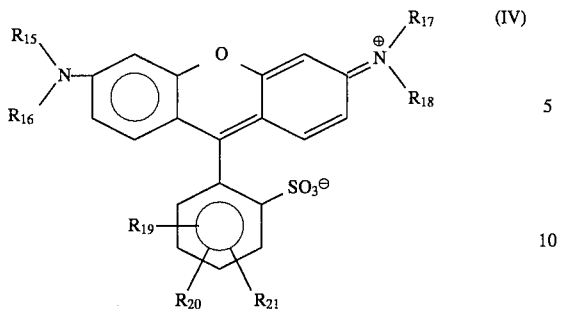

wherein each of $R_{15}$—$R_{18}$ is independently a hydrogen atom or an alkyl group or aryl group which may be substituted, each of $R_{19}$—$R_{21}$ is independently a hydrogen atom, an alkyl group or aryl group which may be substituted, a sulfonicacid group, a sulfonicacid salt group or —SO$_2$—NH—R (R is as defined above), provided that the substituent of the aryl group represented by $R_{15}$—$R_{18}$ and at least one of the $R_{19}$—$R_{21}$ are —SO$_2$—NH—R (R is as defined above);

a dye represented by the following formula (V)

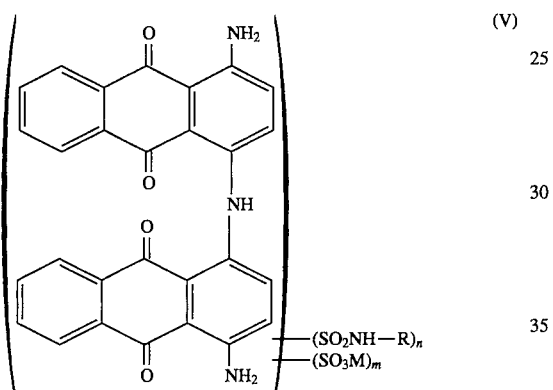

wherein m and n are the average substitution number of SO$_3$M and SO$_2$—NH—R, respectively, both of which being substituents of anthraquinone ring, and m and n are 0–4 and 1–6 respectively provided that m+n≦6, R is as defined above and SO$_3$M is a sulfonicacid or a sulfonicacid salt group;

a dye represented by the following formula (VI)

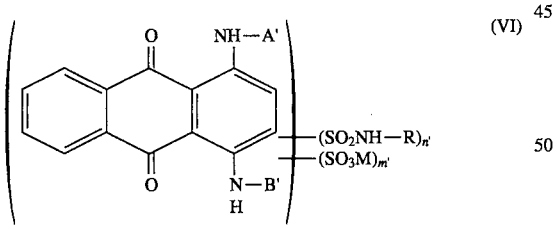

wherein each of A' and B' is independently a hydrogen atom or an alkyl or aryl group which may be substituted provided that both of A' and B' are not hydrogen atoms at the same time, m' and n' are the average substitution number of SO$_3$M and SO$_2$—NH—R, respectively, which may be a substitutent of the A' and/or B' or of anthraquinone ring, and m' and n' are 0–2 and 1–3 respectively provided that m'+n'≦3, R and SO$_3$M are as defined above; and compounds represented by the following formulae can be referred to;

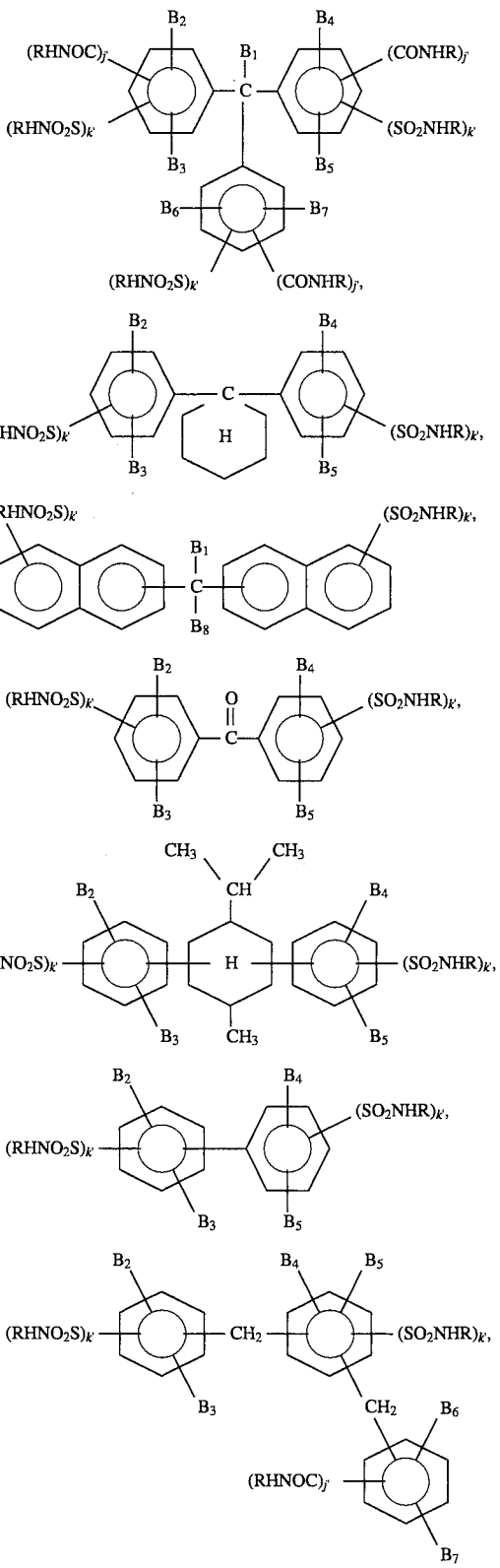

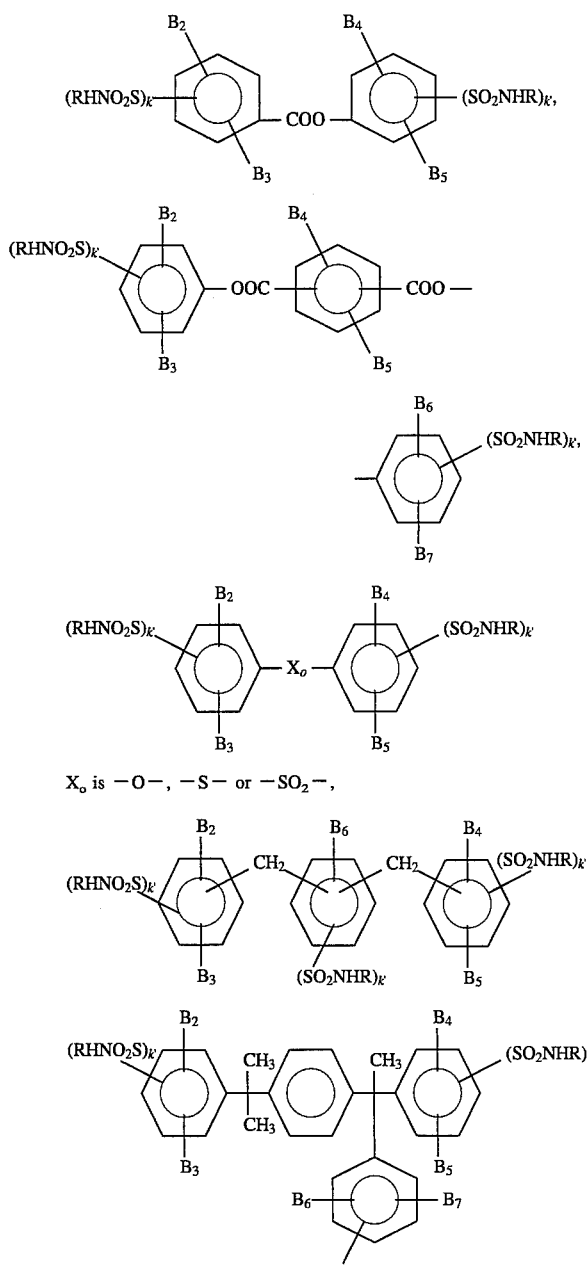

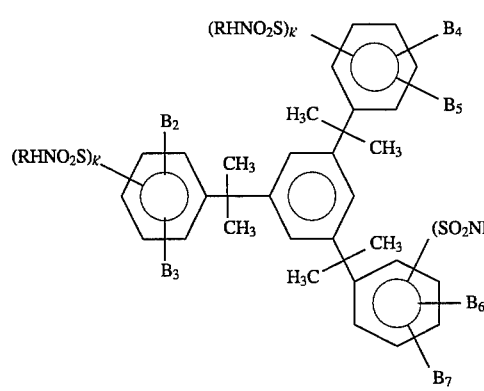

wherein R is as defined above, each of $B_1$ and $B_8$ is independently a hydrogen atom or lower alkyl, each of $B_2$—$B_7$ is independently a carboxylicacid group, a carboxylicacid salt group, a sulfonicacid group, a sulfonicacid salt group, a hydroxy group, a lower alkyl group or a hydrogen atom and each of k' and j', which are the substitution number of —$SO_2$—NH—R and —CO—NH—R respectively, (R is as defined above), is independently 0–3, provided that k'+j'≧1, and

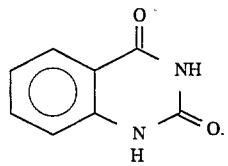

The compound A can be prepared as follows.

When the compound is a dye, a dye selected from the group consisting of dyes, for example, listed in C.I. Acid Colour or C.I. Direct Colour etc. is reacted with thionyl chloride in dimethyl formaldehyde to obtain corresponding sulfonylchloride, and then the resulting sulfonylchloride is reacted with a primary amine represented by the formula R—$NH_2$ to obtain the compound A.

When the compound is not a dye, a phenolic compound which can be used as a starting material for a sensitizer, an ingredient of a positive photoresist for a production of semiconductors, or an alkali-soluble phenolic compound which can be used as an additive to the photoresist is reacted with conc. sulfuric acid, fuming sulfuric acid, chlorosulfonic acid or the like to be substituted by a sulfonic acid group. Then the resulting compound is carboxylated if necessary, and reacted with thionyl chloride to obtain a sulfonylchloride, followed by being reacted with above-mentioned primary amine to obtain the compound A.

As preferable examples of dissolution inhibitors, o-benzoquinonediazide sulfonic acid ester, o-naphthoquinonediazide sulfonic acid ester, a compound having two or more tert-butoxycabonyloxy groups and the like can be referred to. O-benzoquinonediazide sulfonic acid ester or o-naphthoquinonediazide sulfonic acid ester usable as an sensitizer in a positive photoresist composition used for a production of semiconductors can be used, but preferable are those prepared by reacting o-benzoquinonediazidesulfonylchloride or o-naphthoquinonediazidesulfonylchloride with one of the phenolic compounds mentioned in J 90-84650 A or J 91-49437 A, which are represented as formula (I) there, in the presence of an organic base such as triethylamine or the like.

As preferable examples of the compound having two or more tert-butoxycabonyloxy groups, compounds represented by the following formulae can be referred to;

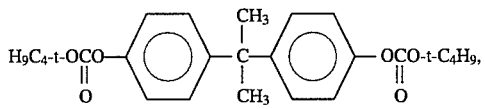

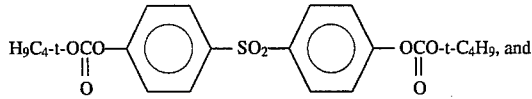

-continued

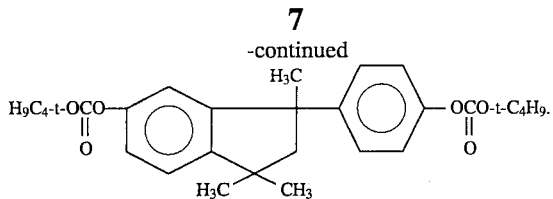

When the dissolution inhibitor is the compound having two or more tert-butoxycabonyloxy groups, the positive type photoresist of this invention contains a photo-induced acid precursor.

Any photo-induced acid precursor can be used in this invention as long as it can be used as an ingredient in a so-called chemical amplification type resist, decompose to directly or indirectly yield an acid by an irradiation of a ray and eliminate the tert-butoxycabonyloxy group from the compound having two or more tert-butoxycabonyloxy groups through a reaction using the thus yeilded acid as a catalyst. As preferable examples of the photo-induced acid precursor, a compound represented by the following formula,

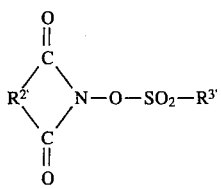

wherein $R^{2'}$ is an arylene, alkylene or alkenylene group which may be substituted and $R^{3'}$ is an alkyl or aryl group which may be substituted;
a trihalomethyltriazine compound mentioned in J92-163552 A;
a disulfon compound mentioned in J89-57777 A;
a compound represented by the following formula,

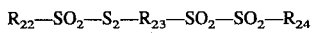

wherein each of $R_{22}$ and $R_{24}$ is independently an alkyl, aryl, aralkyl, cycloalkyl or heterocyclic group which may be substituted and $R_{23}$ is an aryl group which may be substituted; a compound represented by the following formula,

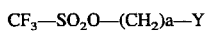

wherein Y is an aryl group which may be substituted and a is 0 or 1;
a compound represented by the following formula,

wherein each of $Y_1$ and $Y_2$ is independently an alkyl, aryl or alkoxy group which may be substituted, $Y_3$ is an aryl group which may be substituted and b is 1 or 2;
a compound represented by the following formula,

wherein $Y_4$ is an alkyl group which may be substituted and $Y_5$ is an aryl group which may be substituted; a compound represented by the following formula,

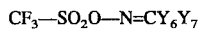

wherein $Y_6$ is a hydrogen atom, an alkyl or aryl group which may be substituted and $Y_7$ is an aryl group which may be substituted;
and an onium salt represented by one of the following formulae,

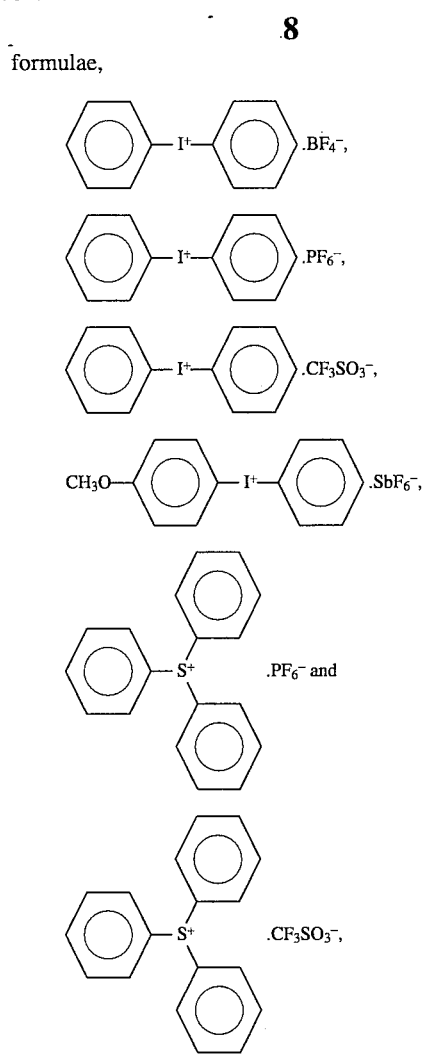

can be referred to.

The positive photoresist composition of this invention may comprise a cross-linking agent in addition to the compound A, a dissolution inhibitor and an organic solvent mentioned below.

Preferable examples of the cross-linking agent include a compound having a group represented by the following formula,

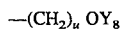

wherein $Y_8$ is a hydrogen atom or a lower alkyl group and u is an integer of 1–4. As examples of the compound having a group represented by above-mentioned formula, a compound represented by the following formula (VII'),

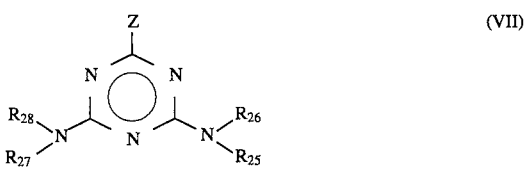

(VII)

wherein Z is $-NR_{29}R_{30}$ or an aryl group which may be substituted, each of $R_{25}-R_{30}$ is independently a hydrogen atom or above-mentioned $-(CH_2)_uOY_8$ ($Y_8$ and u are as defined above), provided that one of $R_{25}-R_{30}$ is $-(CH_2)_uOY_8$; and a compound represented by one of the following formulae,

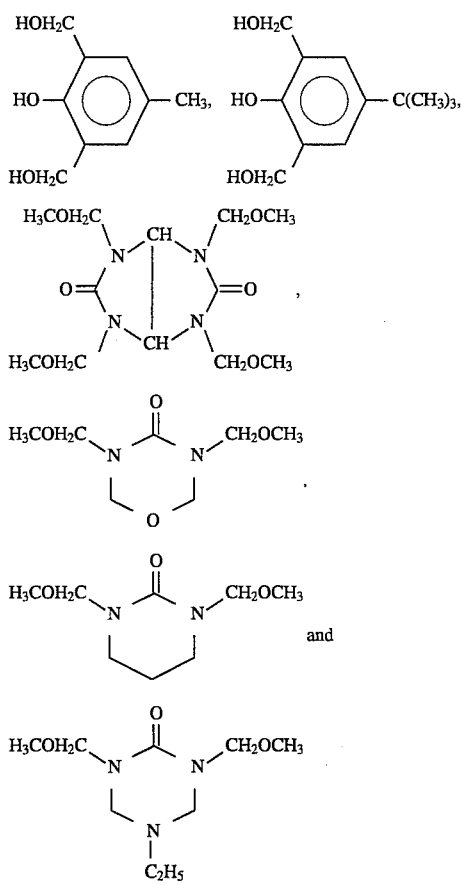

can be referred to. These cross-linking agents are known compounds which are mentioned, for example, in J89-293339 A, etc.

The positive photoresist composition of this invention may further comprise a polymer such as a polymer having —$SO_2NH$— or —CO—NH—CO— group as a matrix resin. However the amount of the polymer must be less than that of the dissolution inhibitor in order to attain the object of this invention.

Preferable examples of the polymer having —$SO_2NH$— group include an alkali-soluble polymer having said group on its side chain or main chain, which can be obtained, for example, by homopolymerizing or copolymerizing a monomer (hereinafter referred to as M1) having one or more —$SO_2NH$— groups and one or more polymerizable unsaturated bonds or by copolymerizing M1 and one or more kinds of monomers (hereinafter referred to as M2) having one or more unsaturated bonds which is copolymerizable with M1 but not having —$SO_2NH$— groups.

As an example of above-mentioned M1, a compound represented by following formula can be referred to:

$$CH_2=CHQ_1—Q_2—Q_3—SO_2NH—Q_4$$

$$CH_2=CHQ_6—Q_7—Q_8—NHSO_2—Q_9$$

wherein each of $Q_1$ and $Q_6$ is independently a hydrogen atom or a methyl group, each of $Q_2$ and $Q_7$ is independently —$CO_2$—, —$CONQ_5$— or a direct bond, each of $Q_3$ and $Q_8$ is independently an alkylene, cycloalkylene, arylene or aralkylene group which has 12 or less carbon atoms and may be substituted or may have an ether group in the middle of the group, and each of $Q_4$, $Q_5$ and $Q_9$ is independently a hydrogen atom, an alkyl, cycloalkyl, aryl or aralkyl group having 12 or less carbon atoms.

As an example of above-mentioned M2, acrylicacid, acrylicacid ester, methacrylicacid, methacrylicacid ester, itaconicacid, crotonic acid, maleic anhydride, acryl amide, methacryl amide, styrenes, vinylethers, vinylesters, etc. can be referred to. When the polymer having —$SO_2NH$— group is a copolymer of above-mentioned M1 and M2, preferable molar ratio of M1 to M2 is from 1:8 to 4:1.

Preferable examples of the polymer having —CO—NH—CO— group include an alkali-soluble polymer having said group on its side chain or main chain and an alkali-soluble polymer having said group which forms a ring with the main chain. Examples of above-mentioned alkali-soluble polymer include a homopolymer and a copolymer of a monomer having one or more —CO—NH—CO— groups and one or more polymerizable unsaturated bonds (hereinafter referred to as M3), and a copolymer of M3 and one or more kinds of monomers which do not have —CO—NE—CO— group but have one or more unsaturated bonds which is copolymerizable with M3 (hereinafter referred to as M4). When the polymer having —CO—NH—CO— group is a copolymer of above-mentioned M3 and M4, preferable molar ratio of M3 to M4 is from 1:8 to 4:1.

Examples of the organic solvent include ethers such as dioxane, diethyleneglycoldimethylether, methylcellosolve, ethylcellosolve, propyleneglycolmonomethylether, propyleneglycolmonoethylether, ethyleneglycolmonoisopropylether and the like, ketones such as methylisobutylketone, methylethylketone, cyclopentanone, cyclohexanone and the like, esters such as ethyl acetate, butyl acetate, methylcellosolveacetate, ethylcellosolveacetate, propyleneglycolmonomethyletheracetate, propyleneglycolmonoethyletheracetate, methyllactate, ethyllactate and the like, amides such as N,N-dimethylformamide, N,N-dimethylacetamide and the like, pyrrolidones such as N-methylpyrrolidone and the like, lactones such as γ-butylolactone and the like and sulfoxides such as dimethylsulfoxide and the like. These solvents can be used either independently or in combination of two or more. The amount of the organic solvent in the positive photoresist composition is determined depending on the situation where the resist is used.

In the positive photoresist composition of this invention, the mixing ratio of the ingredients is preferably as follows: the compound A from 50 to 150 parts by weight, photoinduced acid precursor from 0 to 20 parts by weight and crosslinking agent from 0 to 20 parts by weight based on 100 parts by weight of the dissolution inhibitor. Preferable examples of the ray used for irradiation include ultraviolet light and far ultraviolet light.

Since the positive photoresist composition of this invention comprises an amount of the matrix resin less than the dissolution inhibitor or does not comprise any matrix resin at all, if, for example, it is used for production of color filter, a thin color filter (such as that having thickness of 1–2 μm or thinner) excellent in various properties such as color darkness, color reproductivity, etc. can be obtained. If this photoresist composition is used in printing field or for production of a color filter or a gas sensor, the process for the printing or for the production can be easyly controled.

Next, this invention will be explained in more detail with reference to the following examples. In the examples, "parts" represents "parts by weight" unless otherwise referred to.

In the following examples, experiments were conducted according to the following condition unless otherwise referred to. After coated with the positive photoresist composition by mean of a spinner, a silicon wafer or a quartz glass plate was exposed to the ray through a patterned mask to decompose the dissolution inhibitor. Then the silicon wafer or the quartz glass plate was heated, if necessary, and developed to obtain a positive pattern. The exposure to the ray was conducted with I-line Stepper (HITACHI LD-5010-i, NA=0.40, manufactured by Hitachi Co.). As the developer, SOPD (manufactured by Sumitomo Chemical Co., Ltd.) or 3% aqueous solution of tetramethylammonium hydroxide was used.

REFERENTIAL EXAMPLE 1

A mixture of 20 g of an acid dye [Suminol Milling Yellow 4G, manufactured by Sumitomo Chemical Co., Ltd.] represented by the following formula,

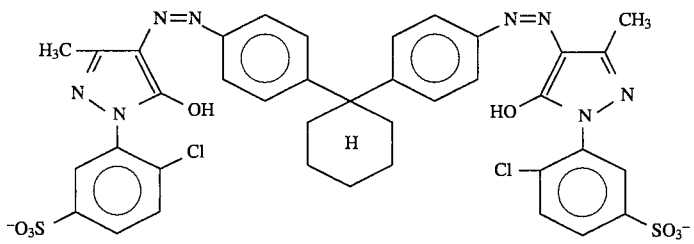

100 ml of thionyl chloride and 15 g of dimethylformamide was allowed to react under refluxing for 30 minutes. Thereafter, the resulting mixture was poured into ice water, extracted with an organic solvent, washed with water, dried and then concentrated to obtain a corresponding sulfonylchloride compound. The sulfonylchloride compound thus obtained was reacted with n-propylamine in tetrahydrofuran with the molar ratio of 1:2 to obtain a sulfoamide compound.

REFERENTIAL EXAMPLE 2

Referential Example 1 was repeated except that an acid dye [Suminol Milling Yellow MR, manufactured by Sumitomo Chemical Co., Ltd.] represented by the following formula

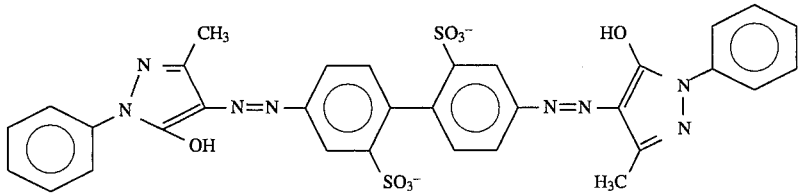

was used instead of Suminol Milling Yellow 4G used in Referential Example 1 to obtain a sulfonylchloride compound. The sulfonylchloride compound thus obtained was reacted with n-propylamine in tetrahydrofuran with the molar ratio of 1:1 to obtain a sulfoamide compound.

REFERENTIAL EXAMPLE 3

Referential Example 1 was repeated except that $C_2H_5O(CH_2)_3NH_2$ was used instead of n-propylamine used in Referential Example 1 to obtain a sulfoamide compound.

REFERENTIAL EXAMPLE 4

Referential Example 1 was repeated except that an amine represented by the following formula

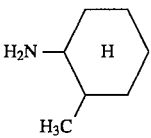

was used instead of n-propylamine used in Referential Example 1 to obtain a sulfoamide compound.

REFERENTIAL EXAMPLE 5

Referential Example 1 was repeated except that an acid dye [Sulpho Rhodamine B] represented by the following formula

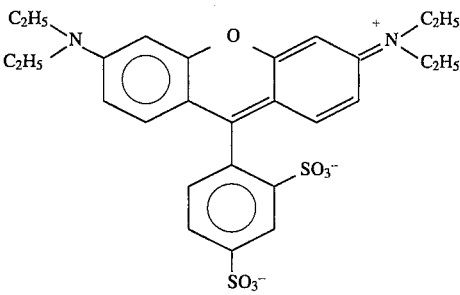

was used instead of Suminol Milling Yellow 4G and 3-(2-ethylhexyloxy)propylamine was used instead of n-propylamine to obtain a sulfoamide compound.

EXAMPLE 1

1.2 Parts of o-naphthoquinonediazide-5-sulfonicacid ester (wherein, on the average, two of the hydroxy groups were esterified) of a phenol compound represented by the following formula,

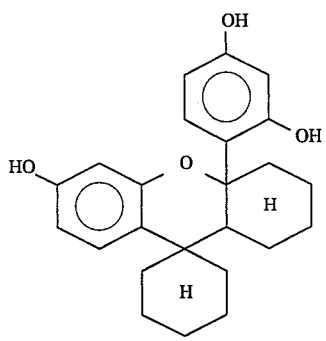

1.2 parts of the sulfoamide compound obtained in Referential Example 1, 2 parts of dimethylformamide and parts of ethyllactate were mixed. The resulting mixture was filtered under elevated pressure through a membrane filter having a pore size of 0.2 μm to prepare a positive photoresist composition. Same procedures were repeated except that a sulfonamide compound obtained in each of Referential Example 2 to 5 was used instead of the sulfonamide compound obtained in Referential Example 1 to prepare a positive photoresist compositions.

EXAMPLE 2

Example 1 was repeated except that Oleosol Fast Blue RL (having a copper-phthalocyanine nucleus, manufactured by TAOKA Chemical Co. Ltd.) was used instead of the sulfonamide compound used in Example 1 to prepare a positive photoresist composition.

EXAMPLE 3

After coated with each of the positive photoresist compositions prepared in Example 1 (which comprise a sulfoamide compound obtained in each of Referential Example 1–5) so as to give a thickness of 0.4 μm, a quartz glass plate was exposed to the ray and then developed with alkali developper to obtain a positive pattern. Whole surface of the pattern thus obtained was exposed to the ray and then heated at 150° C. for 15 minutes to obtain a color filter having various excellent properties such as color darkness.

EXAMPLE 4

After coated with the positive photoresist compositions prepared in Example 2 so as to give a thickness of 0.4 μm, a quartz glass plate was exposed to the ray and then developed with alkali developper to obtain a positive pattern. Whole surface of the pattern thus obtained was exposed to the ray and then heated at 150° C. for 15 minutes to obtain a dot-pattern having cyan color.

EXAMPLE 5

0.2 Part of the compound represented by the following formula,

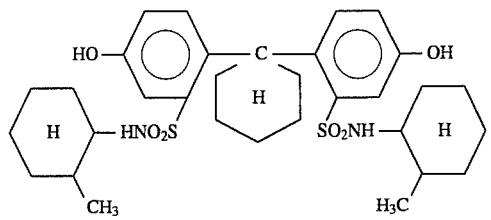

1.2 parts of o-naphthoquinonediazide-5-sulfonicacid ester used in Example 1, 1.2 parts of Oreozolfastblue RL used in Example 2, 0.3 part of hexamethoxymethylolmelamine, 2 parts of dimethylformamide and 10 parts of ethyllactate were mixed. The resulting mixture was filtered under elevated pressure through a membrane filter having a pore size of 0.2 μm to prepare a positive photoresist composition. After coated with the positive type photoresist composition thus prepared so as to give a thickness of 0.4 μm, a quartz glass plate was exposed to the ray and then developed with alkali developper to obtain a positive pattern. Whole surface of the pattern thus obtained was exposed to the ray and then heated at 150° C. for 15 minutes to obtain a dot-pattern having cyan color.

EXAMPLE 6

5 Parts of the compound represented by the following formula,

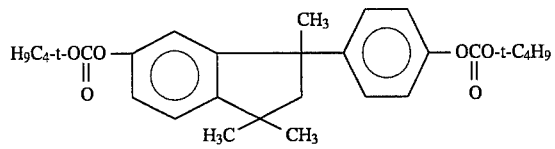

2 parts of N-hydroxysuccineimidemethanesulfonicacid ester (photo-induced acid precursor), 4 parts of the copolymer of N-(p-aminosulfonylphenyl)methacrylamide and ethylhexylacrylate having the weight-average molecular weight of 32400, 5 parts of Oleosol Fast Blue RL, 0.3 part of hexamethoxymethylolmelamine, 12 parts of dimethylformamide and 60 parts of ethyllactate were mixed. The resulting mixture was filtered under elevated pressure through a membrane filter having a pore size of 0.2 μm to prepare a positive photoresist composition. After coated with the positive photoresist composition thus prepared so as to give a thickness of 0.4 μm, a quartz glass plate was exposed to far ultra violet light (248 nm), heated on a hot plate at 120° C. for 1 minute, and then developed with 3% aqueous solution of tetramethylammonium hydroxide to obtain a cyan colored positive pattern having various excellent properties such as color darkness.

What is claimed is:

1. A positive photoresist composition which comprises an effective amount of a compound A in admixture with a dissolution inhibitor and an organic solvent, wherein said compound A is a compound selected from the group consisting of:

(1) cyan dyes of formula (I)

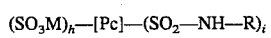

$(SO_3M)_h$—[Pc]—$(SO_2$—NH—R$)_i$  (I)

wherein Pc is phthalocyanine nucleus, h and i are the average substitution number of $SO_3M$ and $SO_2$—NH—R respectively, R is an alkyl, cycloalkyl, alkylcarbonylaminoalkyl, alkylcarbonylamino, cyclohexylalkyl, alkoxy, alkoxyalkyl, aryl, aralkyl or alkylcarbonyloxy group and SO₃M is a sulfonic acid or a sulfonic acid salt provided that h+i<4, h<3 and i+1-4;

(2) azo dyes represented by formula (II)

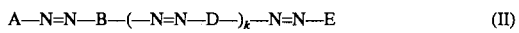

wherein each of A, B, D and E is independently a benzene or naphthalene ring which is unsubstituted or is substituted by —SO₂—NH—R and/or —CO—NH—R and k is 0 or 1, provided that at least one of the A, B, D and E is a benzene-or naphthalene ring which is substituted by —SO₂—NH—R and/or —CO—NH—R; and R is an alkyl, cycloalkyl, alkylcarbonylaminoalkyl, alkylcarbonylamino, cyclohexylalkyl, alkoxy, alkoxyalkyl, aryl, aralkyl or alkylcarbonyloxy group;

(3) yellow dyes represented by formula (III)

wherein M' is a group represented by the following formula

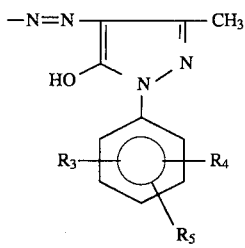

wherein each of R₃—R₅ is independently a hydrogen atom, an alkyl group, a halogen atom, a sulfonic acid group, a sulfonic acid salt group or —SO₂—NH—R, provided that at least one of the R₃—R₅ is —SO₂—NH—R, R is an alkyl, cycloalkyl, alkylcarbonylaminoalkyl, alkylcarbonylamino, cyclohexylalkyl, alkoxy, alkoxyalkyl, aryl, aralkyl or alkylcarbonyloxy group, J is a crosslinking group represented by one of the following formula

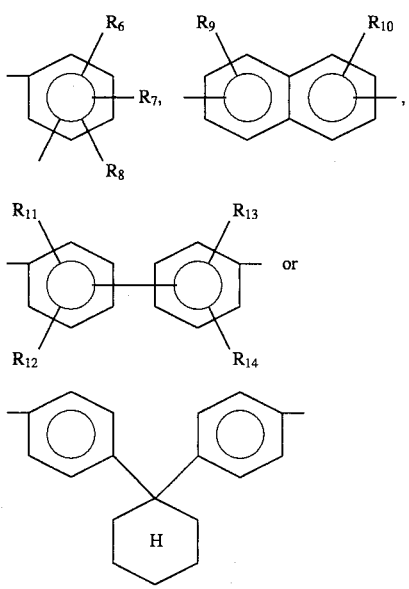

wherein each of R₆—R₁₄ is independently a hydrogen atom, an alkyl group, a halogen atom, a sulfonic acid group, a sulfonic acid salt group or —SO₂—NH—R, R is as defined above, G is M', a hydrogen atom or a phenylazophenyl, napthylazophenyl or phenylazonaphthyl group and R is as defined above;

(4) magenta dyes represented by formula (IV)

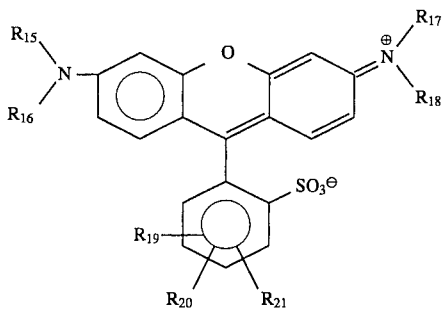

wherein each of R₁₅—R₁₈ is independently a hydrogen atom, an alkyl or aryl group which is unsubstituted or is substituted with —SO₂—NH—R, each of R₁₉—R₂₁ is independently a hydrogen atom, an alkyl group or aryl group which may be substituted with —SO₂—NH—R, a sulfonic acid group, a sulfonic acid salt group or —SO₂—NH—R, provided that at least one of the R₁₉—R₂₁ is —SO₂—NH—R, and R is an alkyl, cycloalkyl, alkyl carbonylaminoalkyl, alkylcarbonylamino, cyclohexylalkyl, alkoxy, alkoxyalkyl, aryl, aralkyl or alkylcarbonyloxy group (5) dyes represented by formula (V)

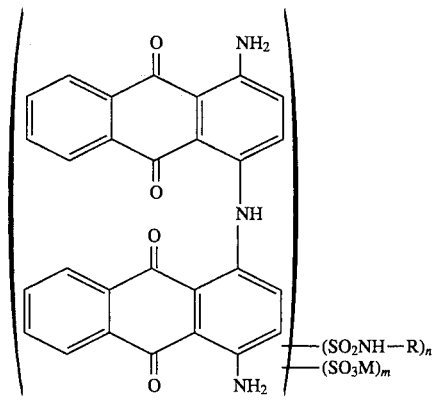

wherein m and n are the average substitution number of SO₃M and SO₂—NH—R, both of which are substituents of anthraquinone ring, respectively, and m and n are 0–4 and 1–6 respectively provided that m+n<6, R is an alkyl, cycloalkyl, alkylcarbonylaminoalkyl, alkylcarbonylamino, cyclohexylalkyl, alkoxy, alkoxyalkyl, aryl, aralkyl or alkylcarbonyloxy group;

(6) dyes represented by formula (VI)

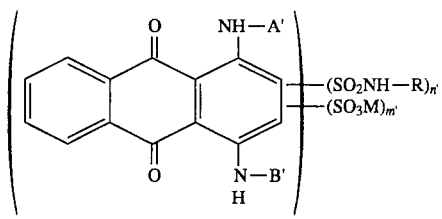

wherein each of A' and B' is independently a hydrogen atom, an alkyl group or an aryl group which substituted with SO₂—NH—R or SO₃M, provided that both of A' and B' are not hydrogen atoms at the same time, m' and n' are the average substitution number of SO$_3$M and SO$_2$—NH—R, both of which may be substituted on only one of the A' and B', on both A' and B' or on the anthraquinone ring, and m' and n' are integers of 0–2 and 1–3 respectively provided that m'+n'<3, R is an alkyl, cycloalkyl, alkylcarbonylaminoalkyl, alkylcarbonylamino, cyclohexylalkyl, alkoxy, alkoxyalkyl, aryl, aralkyl or alkylcarbonyloxy group, and SO$_3$M is a sulfonic acid or a sulfonic acid salt; and (7) compounds represented by the following formulae:

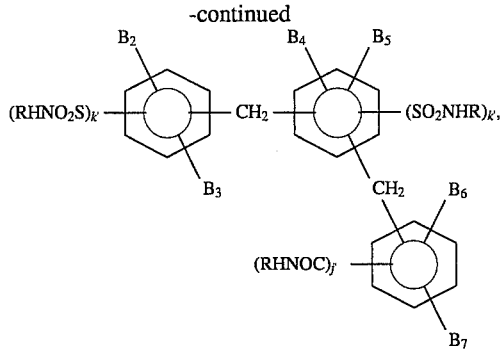

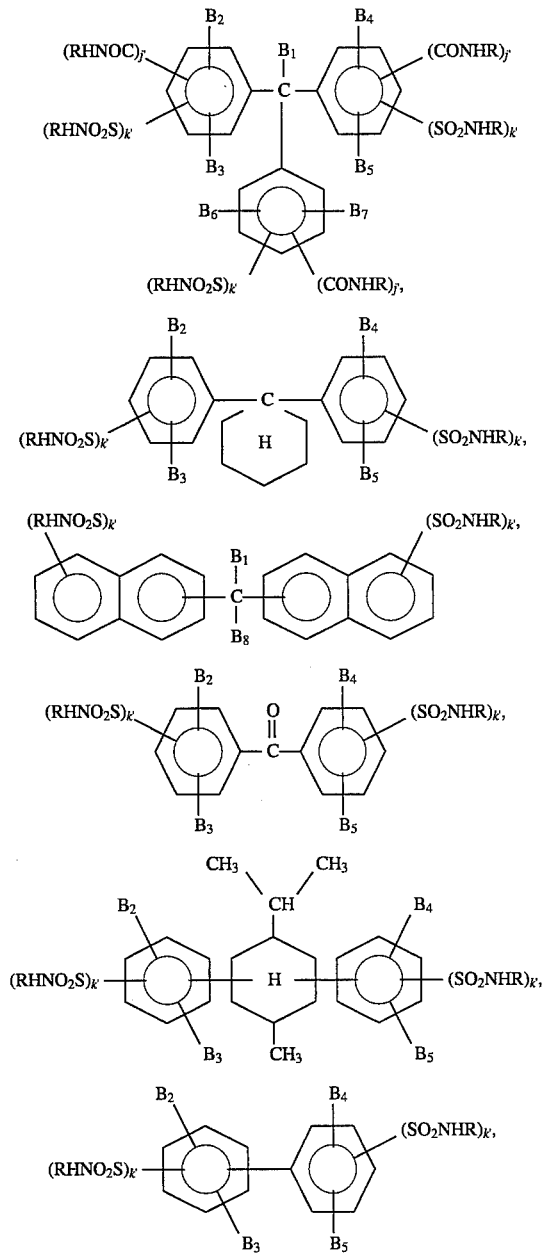

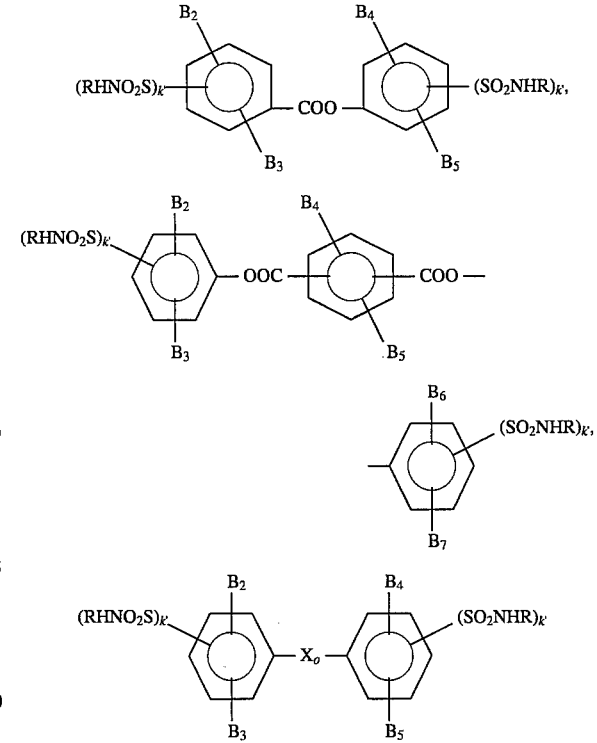

$X_o$ is —O—, —S— or —SO$_2$—,

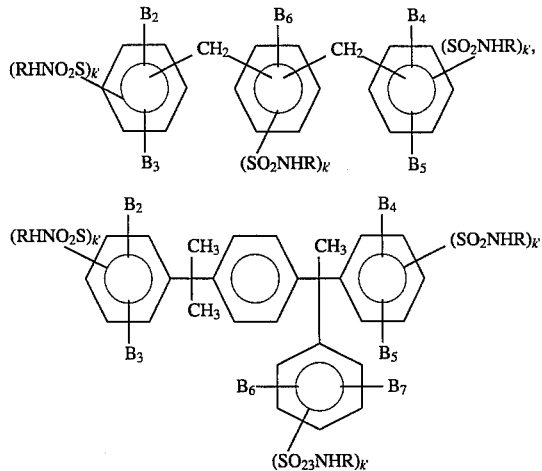

and

-continued

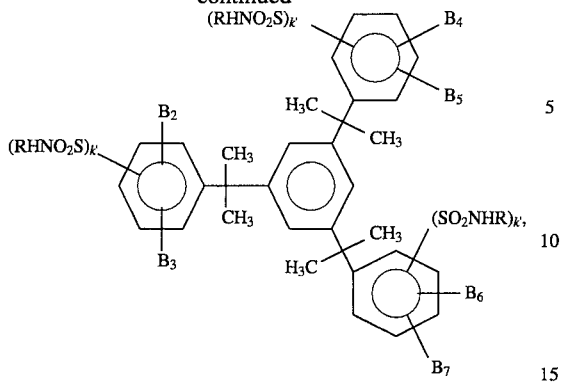

wherein R is an alkyl, cycloalkyl, alkylcarbonylaminoalkyl, alkylcarbonylamino, cyclohexylalkyl, alkoxy, alkoxyalkyl, aryl, aralkyl or alkylcarbonyloxy group, each of $B_1$ and $B_8$ is independently a hydrogen atom or lower alkyl, each of $B_2$ to $B_7$ is independently a carboxylic acid group, a carboxylic acid salt group, a sulfonic acid group, a sulfonic acid salt group, a hydroxy group, a lower alkyl group or a hydrogen atom and each of k' and j', which are the substitution number of —$SO_2$—NH—R and —CO'NH—R respectively, is independently 0–3, provided that k'+j'<1, and

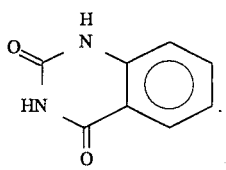

2. The positive photoresist composition according to claim 1 wherein the dissolution inhibitor is o-benzoquinonediazide sulfonic acid ester or naphthoquinonediazide sulfonic acid ester.

3. The positive photoresist composition according to claim 1 wherein compound A is a cyan dye represented by the formula (I)

$$(SO_3M)_h\text{—[Pc]—}(SO_2\text{—NH—R})_i \qquad (I)$$

wherein Pc is phthalocyanine nucleus, h and i are the average substitution number of $SO_3M$ and $SO_2$—NH—R respectively, R is an alkyl, cycloalkyl, alkylcarbonylaminoalkyl, alkylcarbonylamino, cyclohexylalkyl, alkoxy, alkoxyalkyl, aryl, aralkyl or alkylcarbonyloxy group and $SO_3M$ is a sulfonic acid or a sulfonic acid salt provided that h+i<4, h<3 and i=1–4.

4. The positive photoresist composition according to claim 1 wherein compound A is a diazo dye or triazo dye represented by formula (II)

$$A\text{—N=N—}B\text{—}(\text{—N=N—D—})_k\text{—N=N—E} \qquad (II)$$

wherein each of A, B, D and E is independently a benzene or naphthalene ring which is unsubstituted or is substituted by —$SO_2$—NH—R and —CO—NMR, and k is 0 or 1, provided that at least one of the A, B, D and E is a benzene or naphthalene ring which is substituted by —$SO_2$—NH—R and/or —CO—NH—R; and R is an alkyl, cycloalkyl, alkylcarbonylaminoalkyl, alkylcarbonylamino, cyclohexylalkyl, alkoxy, alkoxyalkyl, aryl, aralkyl or alkylcarbonyloxy group.

5. The positive photoresist composition according to claim 1 wherein compound A is a yellow dye represented by formula (III)

$$G\text{—}J\text{—}M' \qquad (III)$$

wherein M' is a group represented by the following formula

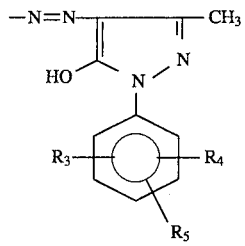

wherein each of $R_3$—$R_5$ is independently a hydrogen atom, an alkyl group, a halogen atom, a sulfonic acid group, a sulfonic acid salt group or —$SO_2$—NH—R, provided that at least one of the $R_3$—$R_5$ is —$SO_2$—NH—R, R is an alkyl, cycloalkyl, alkylcarbonylaminoalkyl, alkylcarbonylamino, cyclohexylalkyl alkoxy, alkoxyalkyl, aryl, aralkyl or alkylcarbonyloxy group, J is a crosslinking group represented by one of the following formula

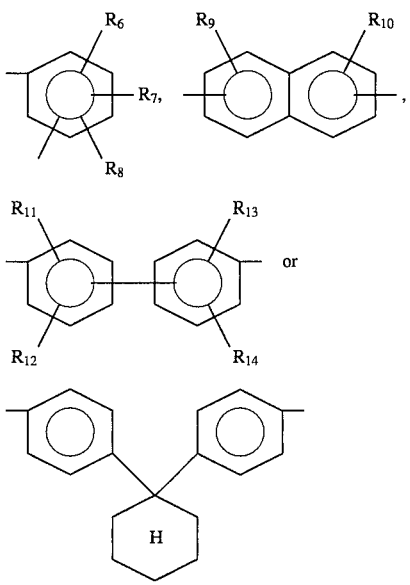

wherein each of $R_6$-$R_4$ is independently a hydrogen atom, an alkyl group, a halogen atom, a sulfonicacid group, a sulfonicacid salt group or —SO—$_2$—NH—R, R is as defined above, G is M', a hydrogen atom or a phenylazophenyl, napthylazophenyl or phenylazonaphthyl group which may be substituted and R is as defined above.

6. The positive photoresist composition according to claim 1 wherein compound A is a magenta dye represented by the formula (IV)

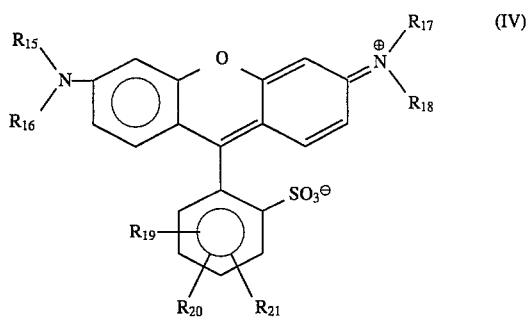

wherein each of $R_{15}$—$R_{18}$ is independently a hydrogen atom, an alkyl or an aryl group which is unsubstituted or is substituted with —$SO_2$—NH—R, each of $R_{19}$—$R_{21}$ is independently a hydrogen atom, an alkyl group or aryl group which is unsubstituted or is substituted with —$SO_2$—NH—R, a sulfonic acid group, a sulfonic acid salt group or —$SO_2$—NH—R, provided that at least one of the $R_{19}$—$R_{21}$ is —$SO_2$—NH—R, and R is an alkyl, cycloalkyl, alkylcarbonylaminoalkyl, alkylcarbonylamino, cyclohexylalkyl, alkoxy, alkoxyalkyl, aryl, aralkyl or alkylcarbonyloxy group.

7. The positive photoresist composition according to claim 1 wherein compound A is a dye represented by the following formula (V)

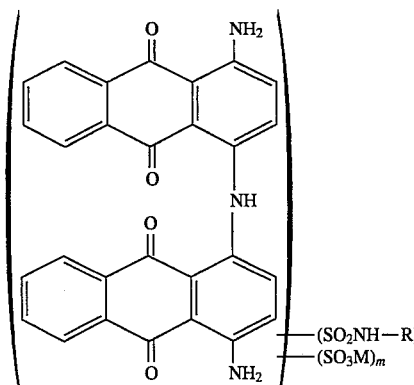

wherein m and n are the average substitution number of $SO_3M$ and $SO_2$—NH—R, both of which are substituents or anthraquinone ring, respectively, and m and n are 0–4 and 1–6 respectively provided that m+n<6, R is an alkyl, cycloalkyl, alkylcarbonyl-aminoalkyl, alkylcarbonylamino, cyclohexylalkyl, alkoxy, alkoxyalkyl, aryl, aralkyl or alkylcarbonyloxy group and $SO_3M$ ie a sulfonic acid or a sulfonic acid salt.

8. The positive photoresist composition according to claim 1 wherein compound A is a dye represented by the following formula (VI)

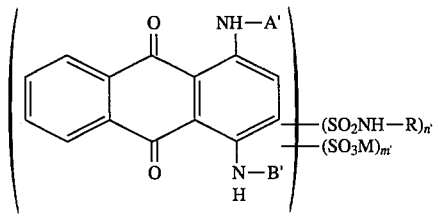

wherein each of A' and B' is independently a hydrogen atom or an alkyl group or an aryl group which is unsubstituted or is substituted with $SO_2$—NH—R or $SO_3M$, provided that both of A' and B' are not hydrogen atoms at the same time, m' and n' are the average substitution number of $SO_3M$ and $SO_2$'NH—R, both of which may be substituted on only one of the A' and B', on both A' and B' or on the anthraquinone ring, and m' and n' are integers of 0–2 and 1–3 respectively provided that m'+n'<3, R is an alkyl, cycloalkyl, alkylcarbonylaminoalkyl, alkylcarbonylamino, cyclohexylalkyl, alkoxy, alkoxyalkyl, aryl, aralkyl or alkylcarbonyloxy group, and $SO_3M$ is a sulfonic acid or a sulfonic acid salt.

9. The positive photoresist composition according to claim 1 wherein compound A is a compound represented by any one of the following formulae:

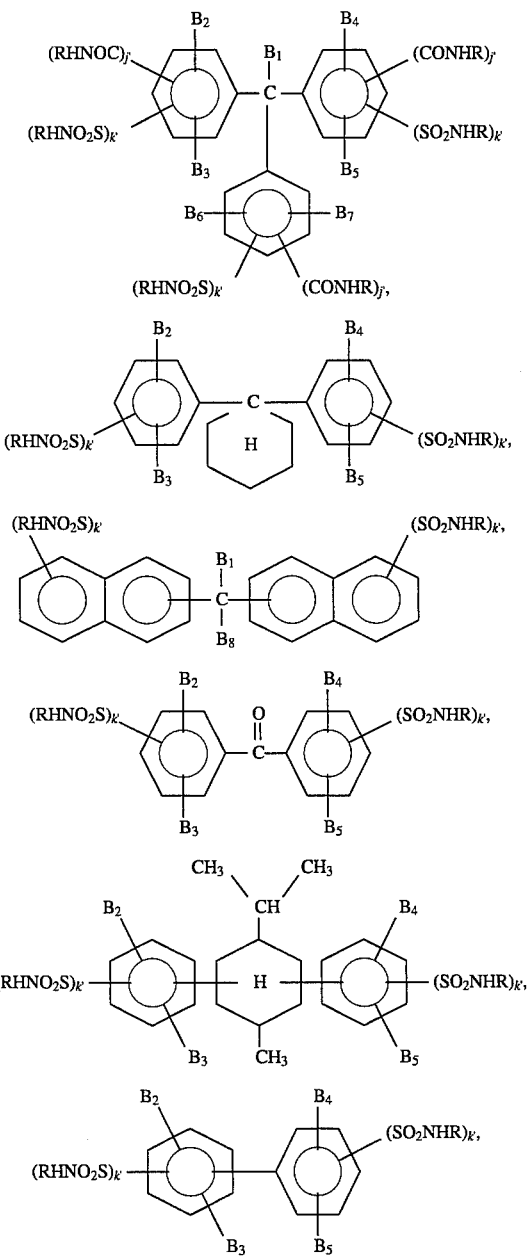

23
-continued

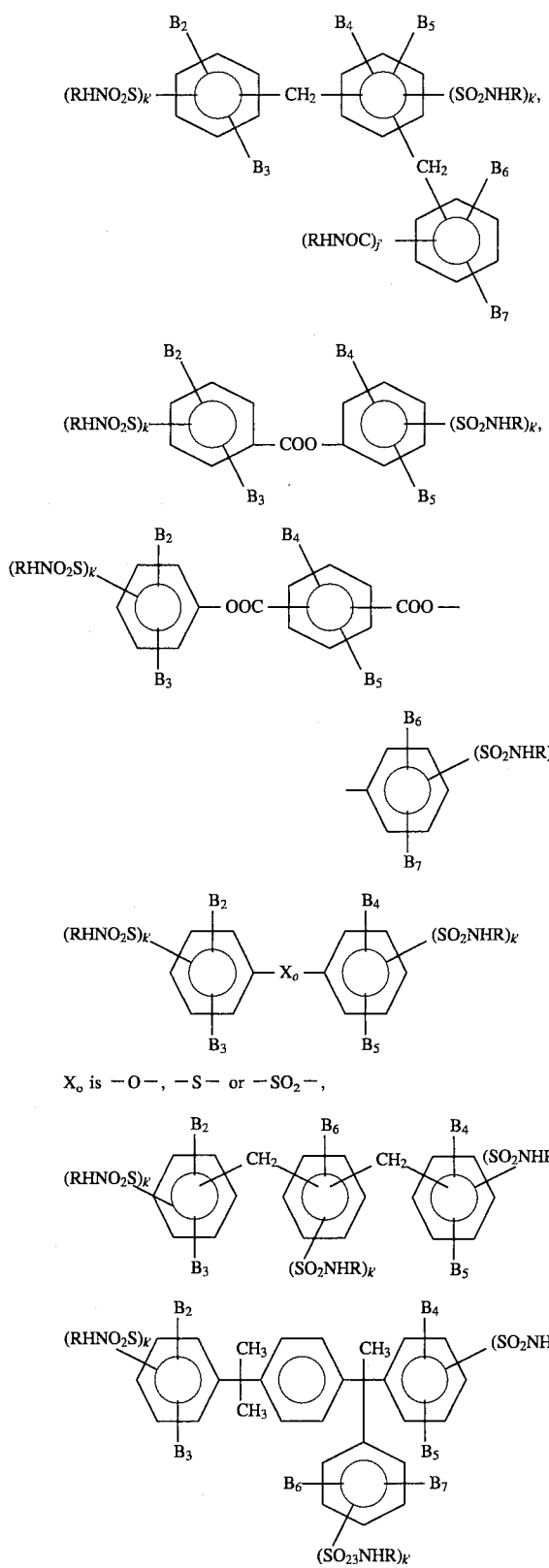

$X_o$ is $-O-$, $-S-$ or $-SO_2-$, and

24
-continued

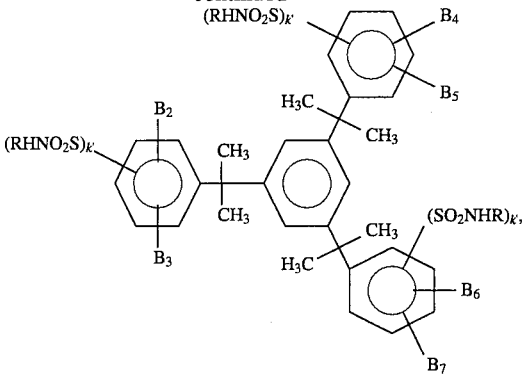

wherein R is an alkyl, cycloalkyl, alkylcarbonylaminoalkyl, alkylcarbonylamino, cyclohexylalkyl, alkoxy, alkoxyalkyl, aryl, aralkyl or alkylcarbonyloxy group, each of $B_1$ and $B_8$ is independently a hydrogen atom or lower alkyl, each of $B_2$ to $B_7$ is independently a carboxylic acid group, a carboxylic acid salt group, a sulfonic acid group, a sulfonic acid salt group, a hydroxy group, a lower alkyl group or a hydrogen atom and each of k' and j', which are the substitution number of $-SO_2-NH-R$ and $-CO-NH-R$ respectively, is independently 0–3, provided that k'+j'>1, and

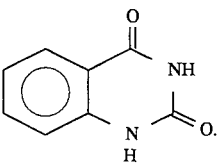

10. The positive photoresist composition according to claim 1 wherein the dissolution inhibitor is a compound having two or more tert-butoxycarbonyl groups and which further comprises a photo-induced acid precursor.

11. The positive photoresist composition according to claim 1 which further comprises a polymer having a $-SO_2NH-$ or $-CO-NH-CO-$ group in an amount less than the dissolution inhibitor.

12. The positive photoresist composition according to claim 1, wherein said composition consists essentially of compound A, a dissolution inhibitor and an organic solvent.

13. The positive photoresist-composition according to claim 12, wherein the dissolution inhibitor is o-benzoquinonediazide sulfonic acid ester or naphthoquinonediazide sulfonic acid ester.

14. The positive photoresist composition according to claim 12, wherein the dissolution inhibitor is a compound having two or more tert-butoxycarbonyl groups and which further comprises a photo-induced acid precursor.

15. The positive photoresist composition according to claim 12, wherein which further comprises a polymer having a $-SO_2NH-$ or $-CO-NH-CO-$ group in an amount less than the dissolution inhibitor.

16. The positive photoresist composition according to claim 2 wherein compound A is a yellow dye represented by formula (III)

$$G-J-M' \qquad (III)$$

wherein M' is a group represented by the following formula

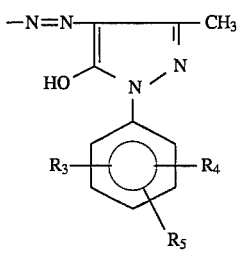

wherein each of $R_3$—$R_5$ is independently a hydrogen atom, an alkyl group, a halogen atom, a sulfonic acid group, a sulfonic acid salt group or —$SO_2$—NH—R, provided that at least one, of the $R_3$-$R_5$ is —$SO_2$—NH—R, and R is an alkyl, cycloalkyl, alkylcarbonylaminoalkyl, alkylcarbonylamino, cyclohexylalkyl, alkoxy, alkoxyalkyl, aryl, aralkyl or alkylcarbonyloxy group, J is a crosslinking group represented by one of the following formula

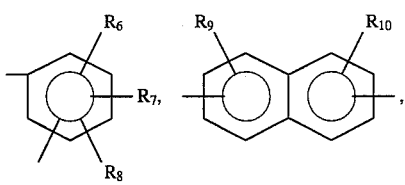

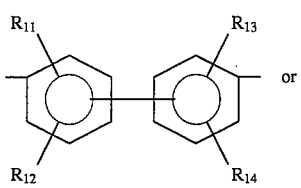

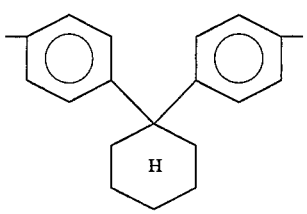

wherein each of $R_6$—$R_{14}$ is independently a hydrogen atom, an alkyl group, a halogen atom, a sulfonic acid group, a sulfonic acid salt group or —SO—$_2$—NH—R, G is M', a hydrogen atom or a phenylazophenyl, napthylazophenyl or phenylazonaphthyl group which may be substituted and R is as defined above.

* * * * *